United States Patent
Sunohara et al.

(10) Patent No.: US 7,084,009 B2
(45) Date of Patent: Aug. 1, 2006

(54) METHOD OF MANUFACTURING A PACKAGING STRUCTURE FOR ELECTRONIC PARTS BURIED IN AN INSULATING FILM FORMED ON THE ELECTRONIC PARTS AND A WIRING SUBSTRATE

(75) Inventors: Masahiro Sunohara, Nagano (JP); Kei Murayama, Nagano (JP); Naohiro Mashino, Nagano (JP); Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 56 days.

(21) Appl. No.: 10/709,858

(22) Filed: Jun. 2, 2004

(65) Prior Publication Data

US 2004/0209399 A1 Oct. 21, 2004

Related U.S. Application Data

(62) Division of application No. 10/720,514, filed on Nov. 25, 2003, now Pat. No. 6,943,442.

(30) Foreign Application Priority Data

Dec. 3, 2002 (JP) ............................. 2002-351526

(51) Int. Cl.
*H01L 21/48* (2006.01)
(52) U.S. Cl. ................. 438/112; 257/E21.503
(58) Field of Classification Search ............ 438/15, 438/108, 112; 257/E21.597, E23.011
See application file for complete search history.

(56) References Cited

U.S. PATENT DOCUMENTS

| | | | |
|---|---|---|---|
| 5,258,094 A * | 11/1993 | Furui et al. | 216/20 |
| 6,365,513 B1 * | 4/2002 | Furukawa et al. | 438/667 |
| 6,608,371 B1 * | 8/2003 | Kurashima et al. | 257/686 |
| 2001/0004130 A1 | 6/2001 | Higashi et al. | 257/686 |
| 2001/0008794 A1 | 7/2001 | Akagawa | 438/620 |
| 2002/0127839 A1 * | 9/2002 | Umetsu et al. | 438/618 |
| 2002/0160598 A1 | 10/2002 | Kong | 438/613 |

FOREIGN PATENT DOCUMENTS

| | | |
|---|---|---|
| EP | 1 248 295 | 10/2002 |
| JP | 2000-323645 | 11/2000 |
| JP | 2001-177045 | 6/2001 |
| JP | 2001-196525 | 7/2001 |

* cited by examiner

*Primary Examiner*—W. David Coleman
*Assistant Examiner*—Jarrett J. Stark
(74) *Attorney, Agent, or Firm*—Armstrong, Kratz, Quintos, Hanson & Brooks, LLP (57) ABSTRACT

A wiring substrate including a predetermined wiring pattern, an electronic parts connection terminal on an element forming surface of which is flip-chip connected to the wiring pattern, an insulating film for covering the electronic parts, a via hole formed in a predetermined portion of the electronic parts and the insulating film on the connection terminal, and an overlying wiring pattern formed on the insulating film and connected to the connection terminal via the via hole.

8 Claims, 11 Drawing Sheets

METHOD OF MANUFACTURING A PACKAGING STRUCTURE FOR ELECTRONIC PARTS BURIED IN AN INSULATING FILM FORMED ON THE ELECTRONIC PARTS AND A WIRING SUBSTRATE

CROSS REFERENCE TO RELATED APPLICATIONS

This application is a divisional application of U.S. patent application Ser. No. 10/720,514, filed Nov. 25, 2003 now U.S. Pat. No. 6,943,442.

BACKGROUND OF THE INVENTION

1. Field of the Invention

The present invention relates to an electronic parts packaging structure and a method of manufacturing the same and, more particularly, an electronic parts packaging structure having such a structure that a plurality of electronic parts are connected mutually in a situation that they are buried in an insulating film and a method of manufacturing the same.

2. Description of the Related Art

The development of the LSI technology as a key technology to implement multimedia devices is proceeding steadily to a higher speed and a larger capacity of the data transmission. According to this, a higher density of the packaging technology as interfaces between the LSI and electronic devices is also proceeding.

In reply to the request of further higher density, the multichip package (semiconductor device) in which a plurality of semiconductor chips are laminated three-dimensionally on the substrate and packaged has been developed. By way of example, there is the semiconductor device having such a structure that a plurality of semiconductor chips are three-dimensionally mounted on the wiring substrate while they are buried in the insulating film respectively and that a plurality of semiconductor chips are connected mutually via the via holes formed in the insulating film and the wiring patterns. For example, such semiconductor device is set forth in Patent Application Publication (KOKAI) 2001-196525 (Patent Literature 1), Patent Application Publication (KOKAI) 2001-177045 (Patent Literature 2), and Patent Application Publication (KOKAI) 2000-323645 (Patent Literature 3).

In recent years, in order to respond to the higher density packaging, the structure is now studied in which a plurality of semiconductor chips are packaged while they are buried in the insulating film in such a manner that the semiconductor chips are connected mutually via the via holes formed in the semiconductor chips and the insulating films. All Patent Literatures 1 to 3 mentioned above are associated with the structure that a plurality of semiconductor chips are connected mutually via the via holes formed in the insulating film. No consideration is given to the above-mentioned packaging structure.

SUMMARY OF THE INVENTION

It is an object of the present invention to provide an electronic parts packaging structure that has a structure in which electronic parts are buried in an insulating film and a plurality of electronic parts are connected mutually via via holes formed in the electronic parts and the insulating film and makes it possible to manufacture the structure by a simple method, and a method of manufacturing the same.

The present invention is concerned with an electronic parts packaging structure, which comprises a wiring substrate including a predetermined wiring pattern; an electronic parts a connection terminal on an element forming surface of which is flip-chip connected to the wiring pattern; an insulating film for covering the electronic parts; a via hole formed in a predetermined portion of the electronic parts and the insulating film on the connection terminal; and an overlying wiring pattern formed on the insulating film and connected to the connection terminal via the via hole.

In the electronic parts packaging structure of the present invention, first the connection terminals of the electronic parts (semiconductor chip, or the like) are flip-chip connected to the wiring patterns on the wiring substrate. Then, the insulating film for covering the electronic parts is formed. Then, the via holes from each of which the connection terminal is exposed are formed by etching continuously predetermined portions of the electronic parts and the insulating film on the connection terminals by means of the RIE or the laser. Then, the overlying wiring patterns connected to the connection terminals via the via holes, which are formed in the electronic parts and the insulating film, are formed on the insulating film.

The present invention is concerned with an electronic parts packaging structure, which comprises a wiring substrate including a predetermined wiring pattern; an electronic parts connection terminal on an element forming surface of which is flip-chip connected to the wiring pattern; an insulating film for covering the electronic parts; a via hole formed in a predetermined portion of the electronic parts and the insulating film on the connection terminal; and an overlying wiring pattern formed on the insulating film and connected to the connection terminal via the via hole.

In one preferred mode of the present invention, the semiconductor chip whose thickness is thinned to about 150 µm or less is used as the electronic parts. Also, the same structural body as the electronic parts, the insulating film, and the overlying wiring pattern, which are formed on the wiring pattern of the wiring substrate, may be repeated n times (n is an integer of 1 or more) on the overlying wiring pattern in a multi-layered fashion, and a plurality of electronic parts may be connected mutually via the via holes.

In this case, since a total thickness of the electronic parts packaging structure can be reduced, such packaging structure can respond to a higher density. In addition, since upper and lower electronic parts are connected mutually via the wirings in the vertical direction, a length of the wiring can be shortened rather than the case that the semiconductor chips are connected via wires or the case that the wirings accompanied by the wiring routing in the lateral direction are provided. As a result, the semiconductor device in the high-frequency application can respond to a higher speed of the signal speed.

In one preferred embodiment of the present invention, a semiconductor chip whose thickness is reduced to about 150 µm or less is used as the electronic parts. Also, the same structural body as the electronic parts, the insulating film, and the overlying wiring pattern, which are formed on the wiring pattern of the wiring substrate, may be repeated n times (n is an integer of 1 or more) on the overlying wiring pattern in a multi-layered fashion, and a plurality of electronic parts may be connected mutually via the via holes.

In this case, because a total thickness of the electronic parts packaging structure can be reduced, such a packaging structure can be formed with a higher density. In addition, because upper and lower electronic parts are connected mutually via the wirings in the vertical direction, a length of the wiring can be shortened rather than the case that the semiconductor chips are connected via wires or the case that the wirings accompanied by the wiring routing in the lateral direction are provided. As a result, the semiconductor device in the high-frequency application can respond to a higher speed of the signal speed.

Also, the present invention is concerned with a method of manufacturing an electronic parts packaging structure, which comprises the steps of flip-chip connecting a connection terminal of electric parts having the connection terminal on an element forming surface to a wiring pattern formed on or over a base substrate; forming an insulating film for covering the electronic parts; forming a via hole having a depth that reaches the connection terminal by etching a predetermined portion from an upper surface of the insulating film to the element forming surface of the electronic parts; and forming an overlying writing pattern, which is connected to the connection terminal via the via hole, on the insulating film.

By doing in this way, in the step of forming the conductive film patterns in the via holes and the opening portions of the resist film, the conductive film patterns are formed by applying sequentially a plating upward from the connection terminals that are exposed from the bottom portions of the via holes. Therefore, the conductive film patterns are filled and formed without generation of the voids in the via holes. As a result, since the reliability of the connection between the connection terminals of the electronic parts and the overlying wiring patterns via the via holes can be improved, yield of the production of the electronic parts packaging structure can be improved.

In one preferred embodiment of the present invention, the step of forming the overlying wiring pattern includes the steps of forming a resist film having an opening portion in a predetermined portion containing the via hole on the insulating film, forming a conductive film pattern in the via hole and the opening portion of the resist film by applying a plating upward from the connection terminal exposed from a bottom portion of the via hole by means of electroplating that utilizes the wiring pattern and the connection terminal of the electronic parts connected to the wiring pattern as a plate power-supply layer, and removing the resist film to get the overlaying wiring pattern.

By doing this, in the step of forming the conductive film patterns in the via holes and the opening portions of the resist film, the conductive film patterns are formed by applying sequentially a plating upward from the connection terminals that are exposed from the bottom portions of the via holes. Therefore, the conductive film patterns are filled and formed without generations of the voids in the via holes. As a result, because the reliability of the connection between the connection terminals of the electronic parts and the overlying wiring patterns via the via holes can be improved, yield of the production of the electronic parts packaging structure can be improved.

DETAILED DESCRIPTION OF THE PREFERRED EMBODIMENTS

Embodiments of the present invention will be explained with reference to the accompanying drawings hereinafter.

First Embodiment

Figure 1A:
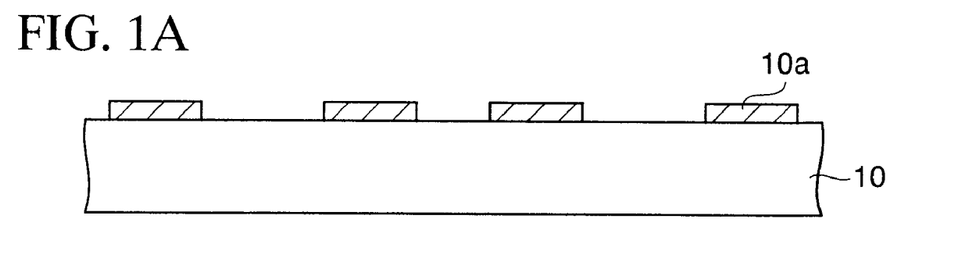
Figure 1B:
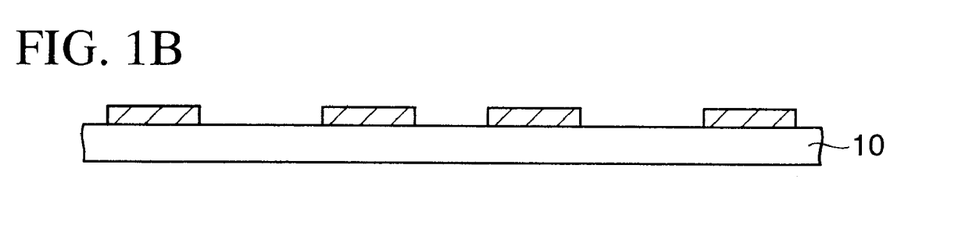

FIGS. 1A to 1K are sectional views showing a method of manufacturing an electronic parts packaging structure of a first embodiment of the present invention in order of steps. In the method of manufacturing an electronic parts packaging structure of a first embodiment of the present invention, first, as shown in FIG. 1A, a semiconductor wafer 10 on which predetermined elements, multi-layered wirings, etc. (not shown) are formed is prepared. Connection pads 10a made of Al, or the like are formed on the element forming surface of the semiconductor wafer 10 to expose. Then, as shown in FIG. 1B, a thickness of the semiconductor wafer 10 is reduced to about 150 μm or less by grinding the element non-forming surface (back surface) of the semiconductor wafer 10.

Figure 1C:
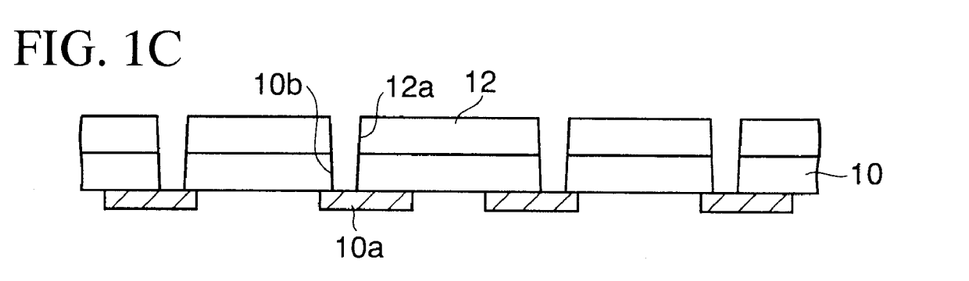

Then, as shown in FIG. 1C, a resist film 12 having opening portions 12a at portions that correspond to predetermined portions of the connection pads 10a is formed on the back surface of the semiconductor wafer 10. Then, the semiconductor wafer 10 is etched from the back surface side by the RIE (Reactive Ion Etching) while using the resist film 12 as a mask. Thus, via holes 10b each having a depth that reaches the connection pad 10a on the element forming surface side of the semiconductor wafer 10 are formed.

Figure 1D:
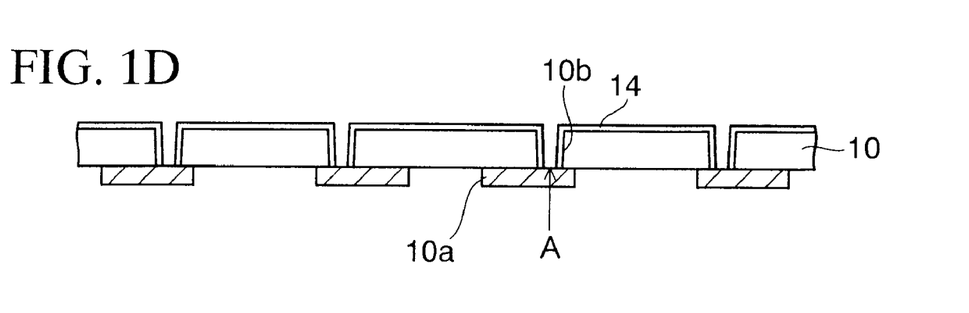

Then, as shown in FIG. 1D, the resist film 12 is removed. Then, an inorganic insulating film 14 made of a silicon oxide film, or the like is formed on inner surfaces of the via holes 10b and the back surface of the semiconductor wafer 10 by the CVD, or the like. Then, the inorganic insulating film 14 is removed from bottom portions of the via holes 10b by the laser, or the like. Thus, the connection pad 10a (the portion indicated by A in FIG. 1D) is exposed from the bottom portions of the via holes 10b. The inorganic insulating film 14 is formed to isolate conductors filled in the via holes 10b from the semiconductor wafer 10.

Figure 1E:
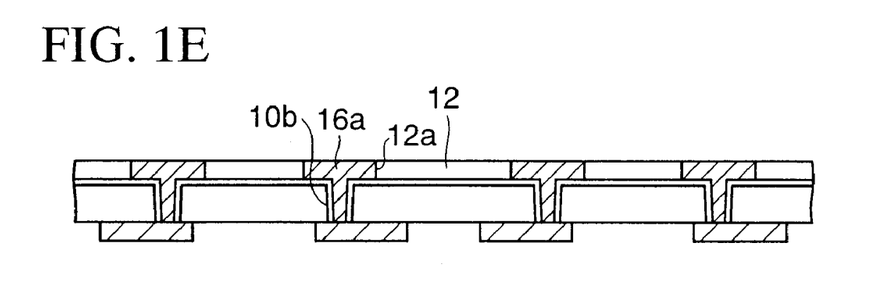

Then, as shown in FIG. 1E, a seed Cu film (not shown) is formed on the inner surfaces of the via holes 10b and the back surface of the semiconductor wafer 10 by the electroless plating or the sputter method. Then, the resist film 12 having the opening portions 12a at predetermined portions containing the via holes 10b is formed on the seed Cu film. Then, Cu film patterns 16a are formed in the via holes 10b and the opening portions 12a of the resist film 12 by the electroplating utilizing the seed Cu film as the plating power-supply layer.

Figure 1F:
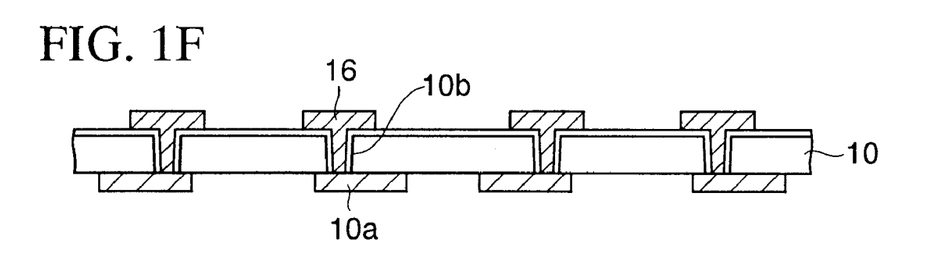
Figure 1G:
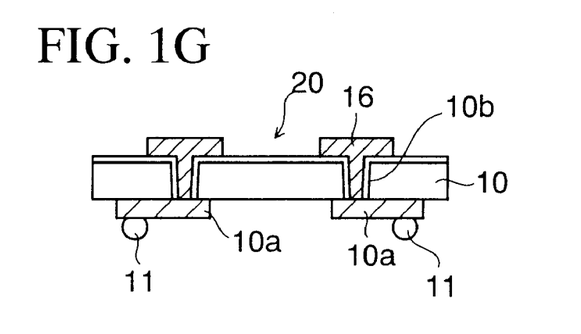
Figure 1H:
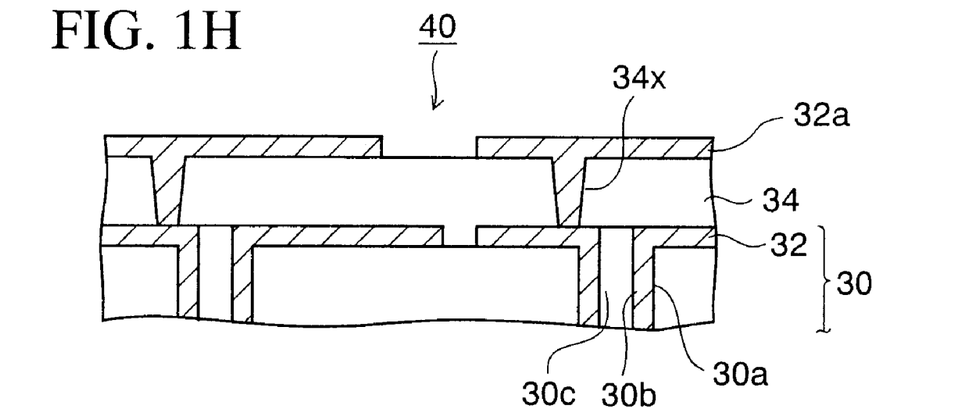

Then, as shown in FIG. 1F, the resist film 12 is removed. Then, through electrodes 16 connected to the connection pads 10a via the via holes 10b are formed by etching the seed Cu film while using the Cu film patterns 16a as a mask. Then, as shown in FIG. 1G, a semiconductor chip 20 that is divided into an individual piece is obtained by dicing the semiconductor wafer 10. Bumps 11 connected to the connection pads 10a of the semiconductor chip 20 are formed before or after the semiconductor wafer 10 is diced. The connection pad 10a and the bump 11 are an example of the connection terminals. In this case, various electronic parts such as a capacitor parts, or the like may be employed in addition to the semiconductor chip 20.

Then, as shown in FIG. 1D, the resist film 12 is removed. Then, an inorganic insulating film 14 made of a silicon oxide film, or the like is formed on inner surfaces of the via holes 10b and the back surface of the semiconductor wafer 10 by the CVD, or the like. Then, the inorganic insulating film 14 is removed from the bottom portions of the via holes 10 by laser, or the like. Thus, the connection pad 10a (the portion indicated by A in FIG. 1D) is exposed from the bottom portions of the via holes 10b. The inorganic insulating film 14 is formed to isolate conductors filed in the via holes 10*b* from the semiconductor wafer 10.

Then, as shown in FIG. 1E, a seed Cu film (not shown) is formed on the inner surfaces of the via holes 10*b* and the back surface of the semiconductor wafer 10 by the electroless plating or the sputter method. Then, the resist film 12 having the opening portions 12*a* at predetermined portions containing the via holes 10*b* is formed on the seed Cu film. Then, Cu film patterns 16*a* are formed in the via holes 10*b* and the opening portions 12*a* of the resist film 12 by electroplating utilizing the seed Cu film as the plating power-supply layer.

Figure 1I:
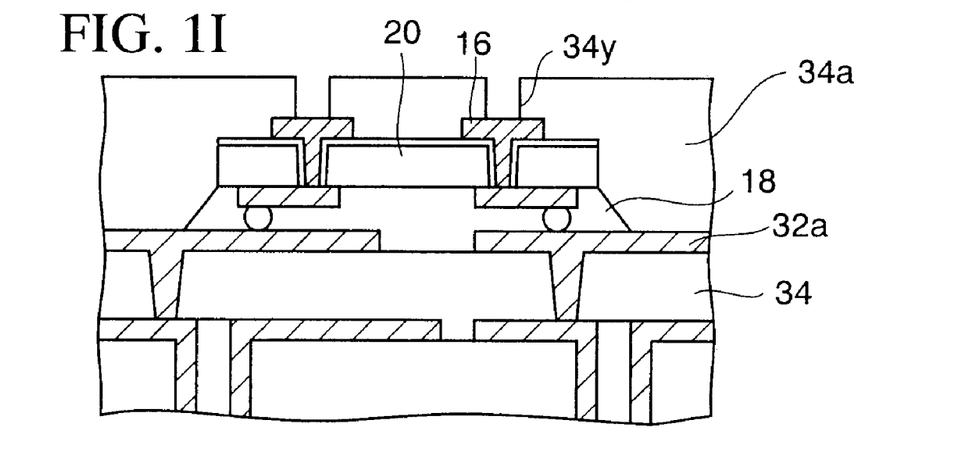

Then, as shown in FIG. 1I, the bumps 11 of the semiconductor chip 20 are flip-chip bonded to the second wiring patterns 32*a* of the wiring substrate 40. Then, an underfill resin 18 is filled into clearances between the semiconductor chip 20, and the second wiring pattern 32*a* and the first interlayer insulating film 34.

Then, a second interlayer insulating film 34*a* for covering the semiconductor chip 20 is formed. Then, predetermined portions of the second interlayer insulating film 34*a* on the through electrodes 16 of the semiconductor chip 20 are etched by the laser, or the like. Thus, second via holes 34*y* each having a depth that reaches an upper surface of the through electrode 16 are formed.

Figure 1J:
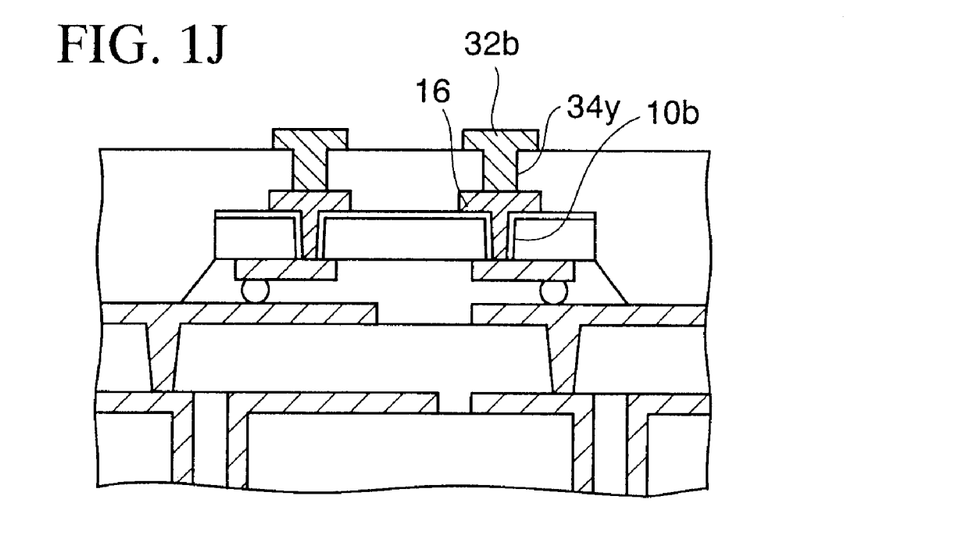

Then, as shown in FIG. 1J, third wiring patterns 32*b* (overlying wiring patterns) connected to the through electrodes 16 via the second via holes 34*y* are formed by the same method (the semi-additive method, or the like) as the method that is applied to form the through electrodes 16 in the via holes 10*b* of the above semiconductor wafer 10.

In this case, after this, respective steps from the step of flip-chip bonding the bumps 11 of the above semiconductor chip 20 onto the second wiring patterns 32*a* to the step of forming the third wiring patterns 32*b* may be repeated predetermined times. In this case, a plurality of semiconductor chips 20 are buried in the interlayer insulating film respectively and packaged three-dimensionally, and a plurality of semiconductor chips 20 are connected mutually via the via holes formed in the semiconductor chips 20 and the interlayer insulating films.

Figure 1K:
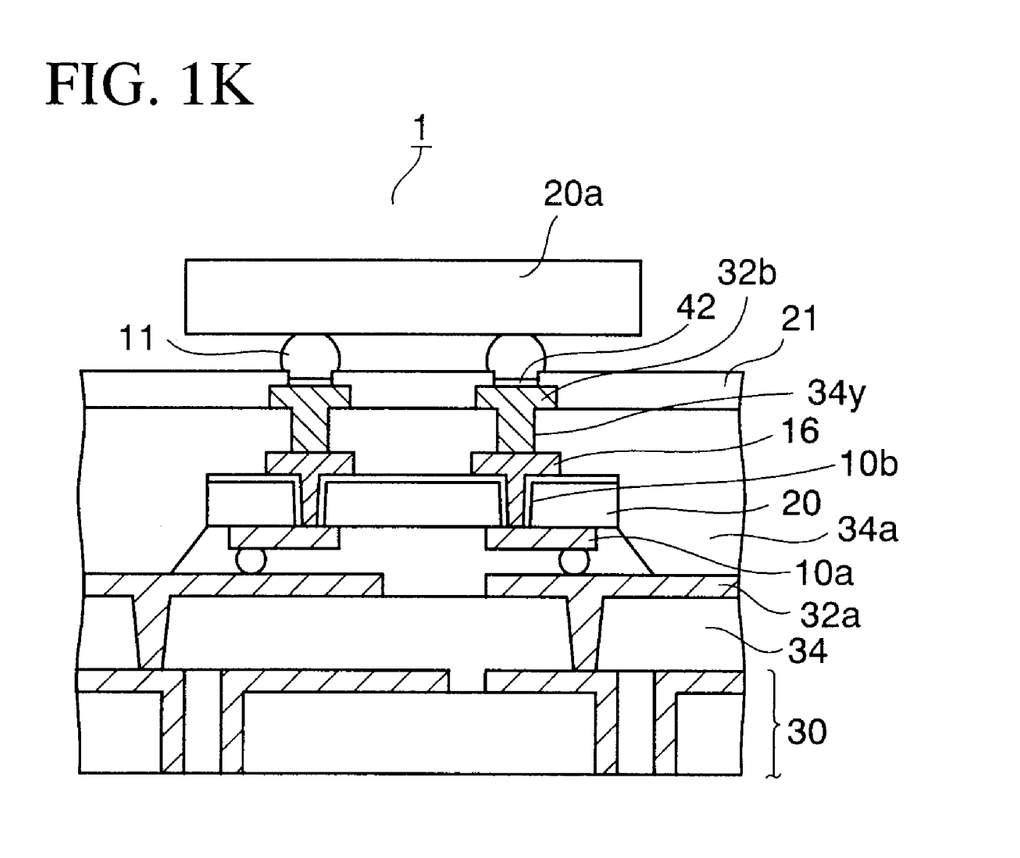

Then, as shown in FIG. 1K, a solder resist film 21 having opening portions at the connection portions of the third wiring patterns 32*b* is formed. Then, an Ni/Au film 42 is formed in the connection portions of the third wiring patterns 32*b* by the electroless plating.

Then, the bumps 11 of an overlying semiconductor chip 20*a* having the bumps 11 are flip-chip bonded to the Ni/Au films 42 on the third wiring patterns 32*b*. With the above arrangement, an electronic parts packaging structure 1 of the present embodiment is obtained.

In the electronic parts packaging structure 1 of the first embodiment, the semiconductor chip 20 a thickness of which is thinned to about 150 µm (preferably about 50 µm) is flip-chip connected to the second wiring patterns 32*a* while such chip is buried in the second interlayer insulating film 34*a*. Then, the via holes 10*b* are formed in the semiconductor chip 20, and then the connection pads 10*a* on the element forming surface are connected to the through electrodes 16 on the back surface via the via holes 10*b*. Also, the via holes 34*y* are formed in the second interlayer insulating film 34*a* that covers the semiconductor chip 20, and then the third wiring patterns 32*b* connected to the through electrodes 16 via the via holes 34*y* are formed.

In addition, a plurality of semiconductor chips 20 each having the similar structure may be stacked three-dimensionally as a multi-layered structure, and then these semiconductor chips 20 may be connected mutually via the through electrodes 16 formed in these chips and the via holes formed in the interlayer insulating films.

Also, the bumps 11 of the overlying semiconductor chip 20*a* are flip-chip bonded to the Ni/Au films 42 on the third wiring patterns 32*b*.

In the electronic parts packaging structure 1 of the first embodiment, the semiconductor chip 20 a thickness of which is reduced to about 150 µm (preferably about 50 µm) is flip-chip connected to the second wiring patterns 32*a* while such chip is buried in the second interlayer insulating film 34*a*. Then, the via holes 10*b* are formed in he semiconductor chip 20, and then the connection pads 10*a* on the element forming surface are connected to the through electrodes 16 on the back surface via the holes 10*b*. Also, the via holes 34*y* are formed in the second interlayer insulating film 34*a* that covers the semiconductor chip 20, and then the third wiring patterns 32*b* connected to the through electrodes 16 via the via holes 34*y* are formed.

Second Embodiment

In addition, a plurality of semiconductor chips 20 each having a similar structure may be stacked three-dimensionally as a multi-layered structure, and then these semiconductor chips 20 may be connected mutually via the through electrodes 16 formed in these chips and the via holes formed in the interlayer insulating films.

In this manner, in the first embodiment, in order to form the third wiring patterns 32*b* connected to the connection pads 10*a* of the semiconductor chip 20 via the via holes so as to rise on the second interlayer insulating film 34*a*, first the via holes 10*b*, 34*y* must be formed in the semiconductor chip 20 and the second interlayer insulating film 34*a* by separate steps respectively (step of forming the via holes is necessary two times (the RIE step and the laser step)). In addition, the through electrodes 16 must be formed in the via holes 10*b* of the semiconductor chip 20 and the third wiring patterns 32*b* must be formed in the via holes 34*y* in the second interlayer insulating film 34*a* in the later step (the electroplating step is necessary two times).

The manufacturing equipments employed in the above RIE step (or the laser step) and the electroplating step are relatively expensive. Therefore, if the man-hour of the RIE or the electroplating is increased like the first embodiment, heavy equipment investments are by necessity required, and as a result the situation to result in an increase in production cost may be supposed. In addition, in some case such a disadvantage is caused that, since the manufacturing man-hour is increased, the appointed date of delivery is delayed.

The method of manufacturing the electronic parts packaging structure of the second embodiment can overcome such disadvantage.

Figure 2A:
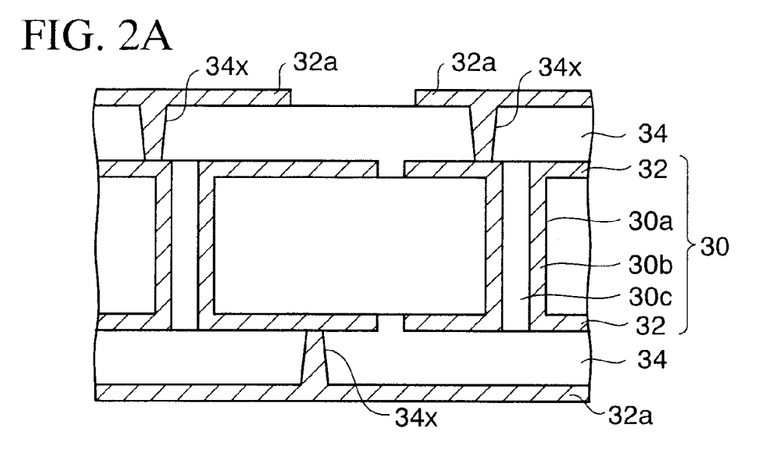

In the method of manufacturing the electronic parts packaging structure of the second embodiment of the present invention, first, as shown in FIG. 2A, the base substrate 30 used to manufacture a built-up wiring substrate is prepared. The base substrate 30 is made of insulating material such as resin, or the like. Then, the through holes 30*a* are provided in the base substrate 30. The through-hole plating layer 30*b* connected to the first wiring pattern 32 provided to both surfaces of the base substrate 30 is formed in the through holes 30*a*. The resin body 30*c* is filled in the holes of the through holes 30*a*.

Then, the first interlayer insulating film 34 for covering the first wiring patterns 32 is formed on both surfaces of the base substrate 30 respectively. As the first interlayer insulating film 34, for example, epoxy resin, polyimide resin, polyphenylene ether resin, or the like is used. In other words, the resin layer is formed by laminating a resin film on the first wiring patterns 32 on both surfaces of the base substrate 30 respectively and then annealing it at 80 to 140° C. to cure.

The manufacturing equipments employed in the above RIE step (or the laser step) and the electroplating step are relatively expensive. Therefore, if the man-hours of the RIE or the electroplating are increased as in the first embodiment, heavy equipment investments are by necessity required, and as a result the situation results in an increase in production cost. In addition, in some case such a disadvantage is caused that, because the manufacturing man-hours are increased, the appointed date of delivery is delayed.

Then, the first via holes 34x are formed by etching predetermined portions of the first interlayer insulating film 34 on the first wiring patterns 32 on both surface sides of the base substrate 30 by means of the laser respectively. Then, the second wiring patterns 32a each connected to the first wiring pattern 32 via the first via hole 34x are formed on the first interlayer insulating film 34 on both surface sides of the base substrate 30 by the semi-additive method, for example, respectively.

More particularly, first the seed Cu film (not shown) is formed on the inner surfaces of the first via holes 34x and the first interlayer insulating film 34 by the electroless plating or the sputter method. Then, the resist film (not shown) having the opening portions that correspond to the second wiring patterns is formed on the seed Cu film. Then, Cu film patterns (not shown) are formed in the opening portions of the resist film by the electroplating utilizing the seed Cu film as the plating power-supply layer.

Then, the resist film is removed, and then the second wiring patterns 32a are formed by etching the seed Cu film while using the Cu film patterns as a mask. In this case, the second wiring patterns 32a may be formed by the subtractive method or the full additive method instead of the semi-additive method.

Figure 2B:
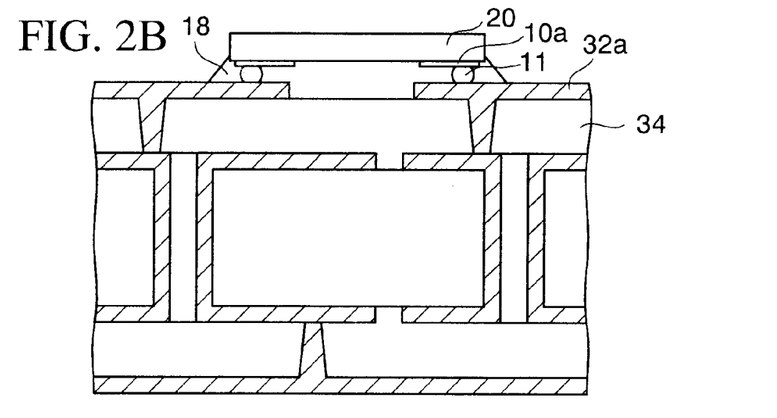

Then, as shown in FIG. 2B, the semiconductor chip 20 having the connection pads 10a and the bumps connected thereto on the element forming surface is prepared. In other words, like FIG. 1A and FIG. 1B in the above first embodiment, the element non-forming surface (back surface) of the semiconductor wafer 10 that has predetermined elements and the connection pads 10a and has a thickness of about 400 μm is ground. Thus, the thickness of the semiconductor wafer 10 is thinned to about 150 μm or less (preferably 50 μm or less). Then, the semiconductor chip 20 that is divided into an individual piece by dicing the semiconductor wafer 10 is obtained. The bumps 11 of the semiconductor chip 20 are formed before or after the semiconductor wafer is subjected to the dicing.

In this case, the connection pad 10a and the bump 11 are an example of the connection terminals. Also, the semiconductor wafer 10 is listed as an example of the electronic parts. But various electronic parts such as a capacitor parts, or the like may be employed in addition to this.

In the second embodiment, the via holes have not been formed in the semiconductor chip 20 at this point of time. As described above, the via holes are formed after the semiconductor chip 20 is mounted.

Then, as shown similarly in FIG. 2B, the bumps 11 of the semiconductor chip 20 are flip-chip bonded to the second wiring patterns 32a. Then, the underfill resin 18 is filled into the clearances between the semiconductor chip 20 and the second wiring pattern 32a and the first interlayer insulating film 34. Alternatively, an insulating resin (NCF or NCP) is coated previously in areas containing the mounted portion of the semiconductor chip 20 before the semiconductor chip 20 is bonded, and then they may be flip-chip bonded with the intervention of this resin.

Figure 2C:
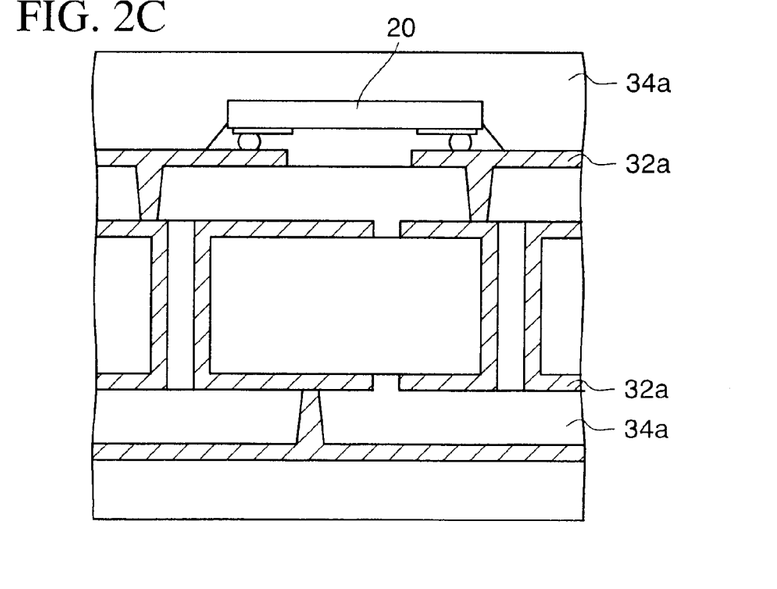

Then, as shown in FIG. 2C, the second interlayer insulating film 34a is formed on the semiconductor chip 20 and the second wiring patterns 32a. Thus, the semiconductor chip 20 is buried in the second interlayer insulating film 34a. The second interlayer insulating film 34a is formed by the same material and method as the above first interlayer insulating film 34. At this time, the second interlayer insulating film 34a is also formed on the second wiring patterns 32a on the surface of the base substrate 30, on which the semiconductor chip 20 is not mounted.

Figure 2D:
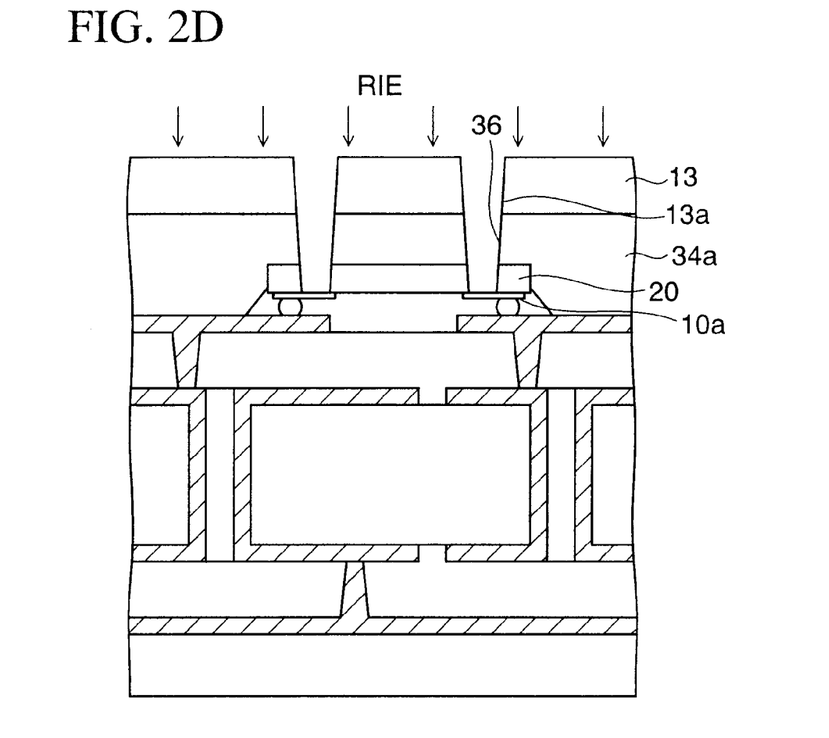

Then, as shown in FIG. 2D, a resist film 13 having opening portions 13a to expose the predetermined portions of the second interlayer insulating film 34a on the connection pads 10a of the semiconductor chip 20 is formed by the photolithography. Then, the second interlayer insulating film 34a and the semiconductor chip 20 are etched by the RIE (Reactive Ion Etching) while using the resist film 13 as a mask. Thus, via holes 36 each having a depth that reaches the connection pad 10a of the semiconductor chip 20 are formed.

One preferred mode of this step will be explained in detail hereunder. At first, the second interlayer insulating film (resin film) 34a is etched under RIE conditions such that oxygen ($O_2$) is used as an etching gas, a pressure is set to 10 to 100 Pa, and a stage temperature is set to the room temperature to about 100° C. Then, the semiconductor chip (silicon chip) 20 is etched under RIE conditions such that sulfur hexafluoride ($SF_6$) is used as an etching gas, a pressure is set to 10 to 100 Pa, and a stage temperature is set to the room temperature to about 100° C. At this time, the etching is stopped by the connection pad 10a made of Al, or the like. Then, the resist film 13 is removed.

In this RIE step, the second interlayer insulating film 34a and the semiconductor chip 20 may be etched in different chambers of the same RIE equipment respectively, or they may be etched in the same chamber after the etching gas is exchanged.

Figure 2E:
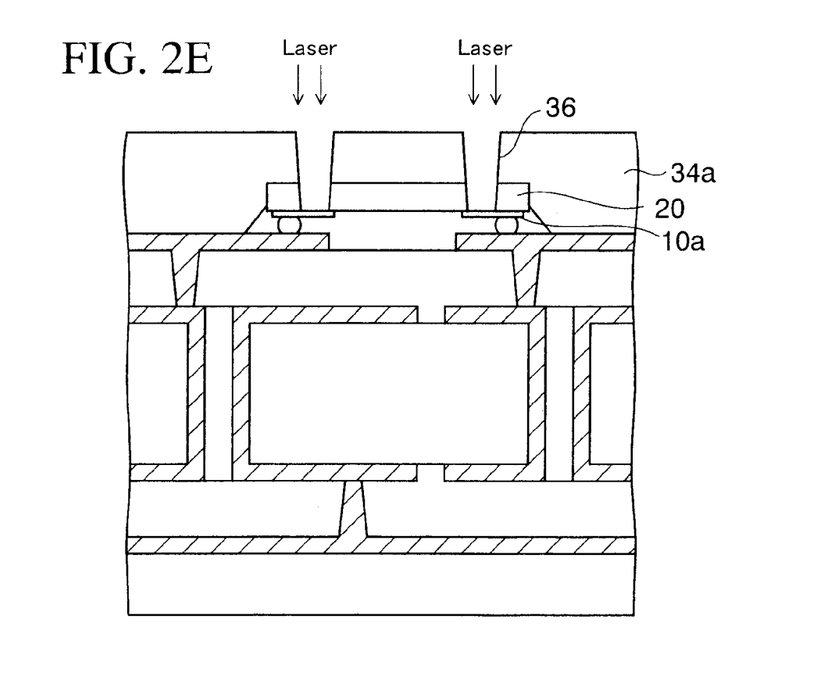

In this step, as shown in FIG. 2E, the via holes 36 may be formed by the laser instead of the above RIE. As one preferred mode in such case, the second interlayer insulating film (resin film) 34a and the semiconductor chip (silicon chip) 20 can be etched continuously under the same conditions by the YAG laser whose oscillation wavelength is 355 nm and whose frequency is 1000 to 5000 Hz. In this case, the etching executed by the laser is also stopped by the connection pad 10a.

In this way, in the method of manufacturing the electronic parts packaging structure of the present embodiment, the RIE is applied or the laser is employed after the second interlayer insulating film 34a is formed on the semiconductor chip 20, so that the via holes 36 are formed by etching continuously the second interlayer insulating film 34a and the semiconductor chip 20. That is, the via holes 36 are formed simultaneously in the second interlayer insulating film 34a and the semiconductor chip 20 by the very simple method.

In this case, in the above first embodiment, since the via holes 10b must be formed by etching the semiconductor wafer 10 that is thinned and has small rigidity, there is a limit to the reduction in thickness if the handling, etc. in etching the thinned semiconductor wafer 10 by the RIE equipment, or the like are taken in consideration. However, in the second embodiment, since the via holes 36 are formed in the circumstance that the thinned semiconductor chip 20 is mounted onto the wiring substrate 40 that has large rigidity, the second embodiment is convenient from the viewpoint that the thickness of the semiconductor wafer 10 can be reduced rather than the first embodiment.

Figure 2F:
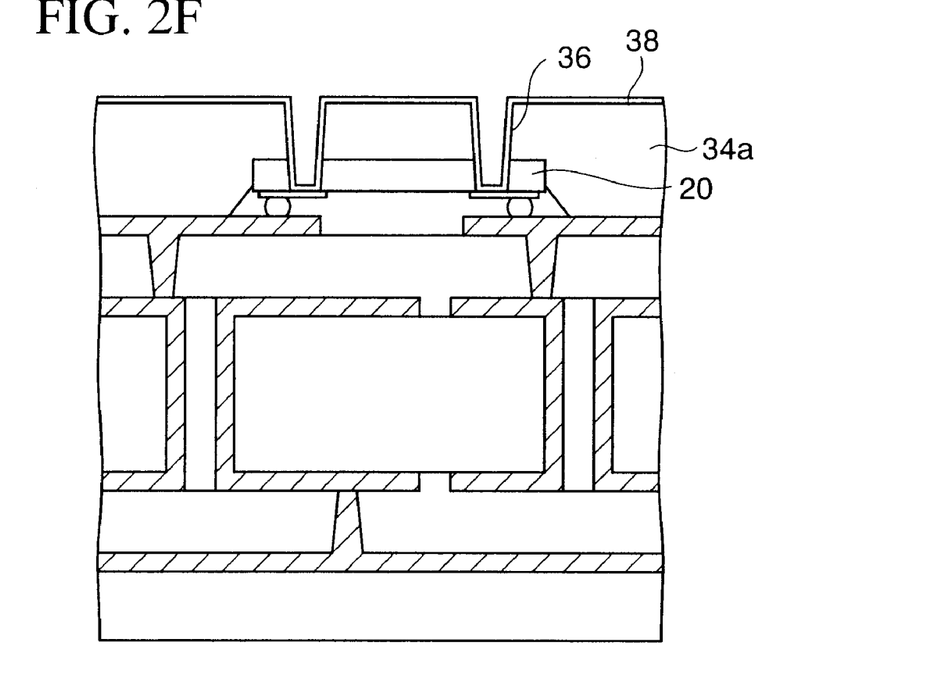

Then, as shown in FIG. 2F, an inorganic insulating film 38 made of a silicon oxide film, or the like is formed on inner surfaces of the via holes 36 and an upper surface of the second interlayer insulating film 34a by the CVD, or the like. This inorganic insulating film 38 is formed to insulate the semiconductor chip 20 from a conductor that is filled in the via holes 36 in the later step. In this case, since the inorganic insulating film 38 is also left as the interlayer insulating film, sometimes the second interlayer insulating film 34a containing the inorganic insulating film 38 is also referred to as the second interlayer insulating film 34a (insulating film).

Figure 2G:
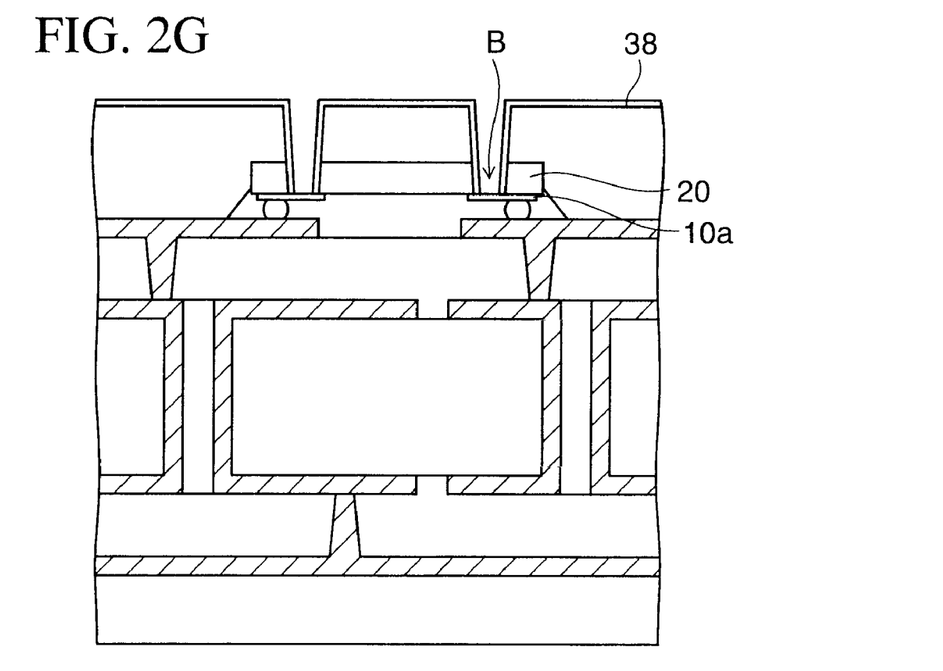

Then, as shown in FIG. 2G, the inorganic insulating film 38 on the bottom portions of the via holes 36 is etched by the laser, or the like and is removed. Thus, a part of the connection pads 10a of the semiconductor chip 20 (portions indicated by B in FIG. 2G) is exposed from the bottom portions of the via holes 36.

Figure 2H:
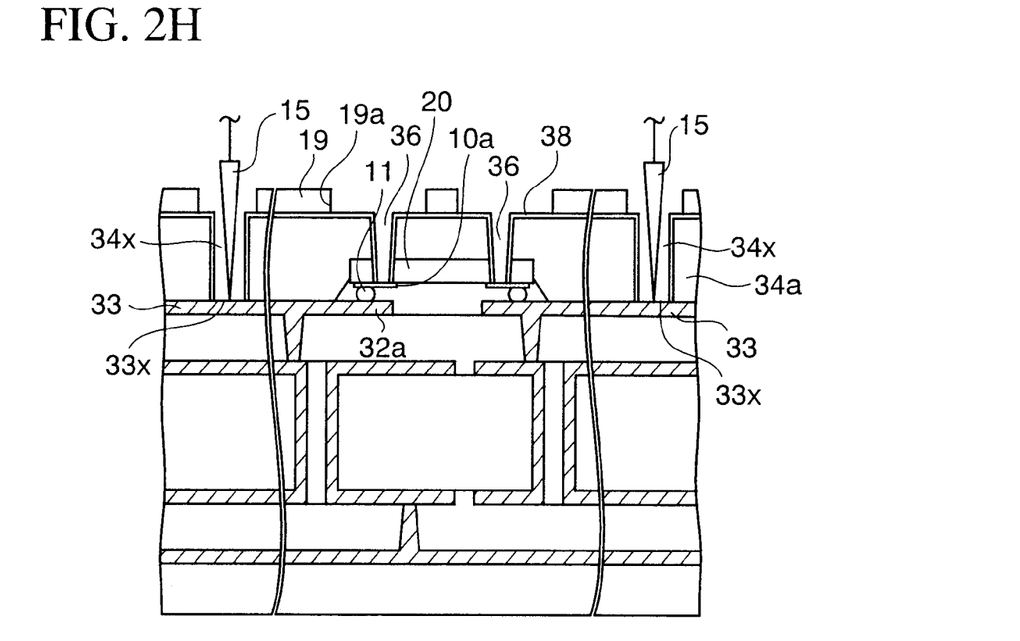

Then, a method of forming the third wiring patterns, which are connected to the connection pads 10a of the semiconductor chip 20 via the via holes 36, by the electroplating will be explained hereunder. In the present embodiment, as shown in FIG. 2H, the second wiring patterns 32a are connected to an outer-frame wiring portion 33 provided on the outer peripheral portion prior to the formation of the third wiring patterns, and also plating power-supply portions 33x for supplying a plating current are defined in the outer-frame wiring portion 33. The opening portions 34x are formed by etching the second interlayer insulating film 34a and the inorganic insulating film 38 on the plating power-supply portions 33x. Thus, the plating power-supply portions 33x are exposed from inner sides of the opening portions 34x.

Then, cathode electrodes 15 of the electroplating equipment are connected to the plating power-supply portions 33x of the outer-frame wiring portion 33 upon applying the electroplating, and then the second wiring patterns 32a connected to the outer-frame wiring portion 33 function as the plating power-supply layer. That is, a plating current is supplied to the connection pads 10a of the semiconductor chip 20 via the second wiring patterns 32a and the bumps 11 of the semiconductor chip 20 connected to the second wiring patterns 32a.

Figure 2I:
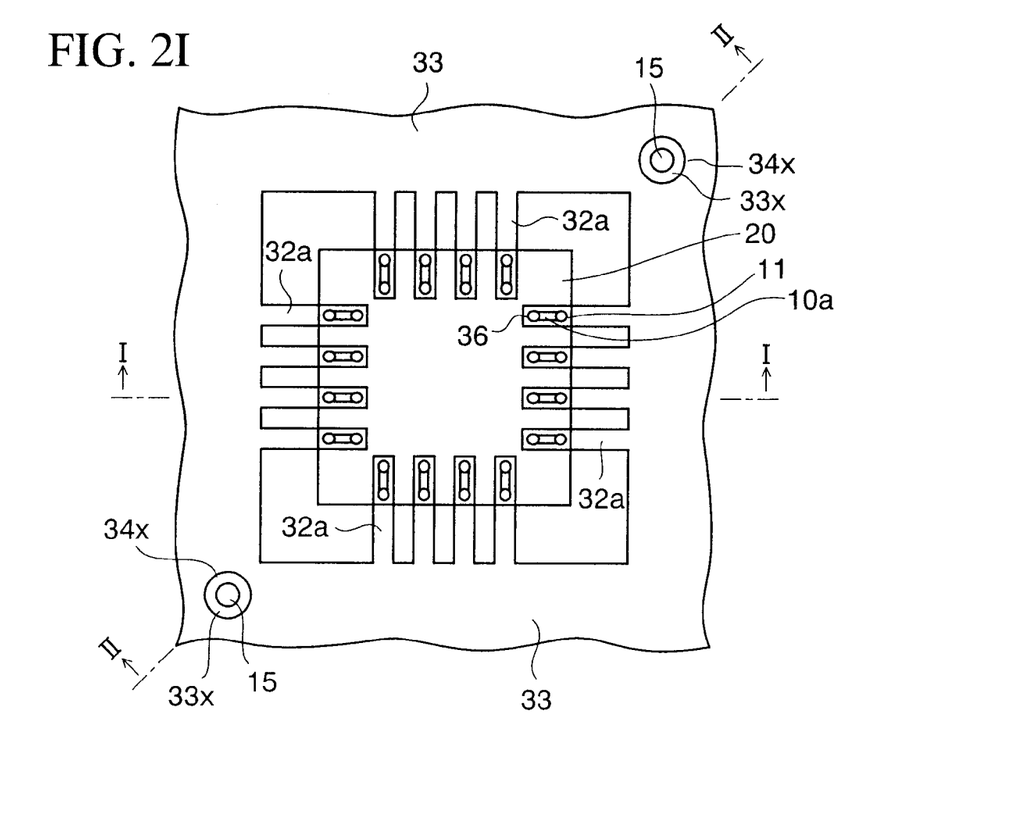

A perspective view depicted by looking through this structure from the top side in FIG. 2H is given in FIG. 2I. In this case, FIG. 2H corresponds to a synthesized view of a sectional view taken along a I—I in FIG. 2I and a sectional view taken along a II—II in FIG. 2I. Also, in FIG. 2I, a resist film 19 is omitted from the illustration.

As shown in FIG. 2I, the bumps 11 of the semiconductor chip 20 are bonded to the second wiring patterns 32a formed like the teeth of a comb. These second wiring patterns 32a are connected to the outer-frame wiring portion 33 provided to the outer peripheral portion of the packaging area of the semiconductor chip 20. In addition, the opening portions 34x are formed on the plating power-supply portions 33x that are defined in the outer-frame wiring portion 33, and then the cathode electrodes 15 of the electroplating equipment are connected to the plating power-supply portions 33x. Then, as described above, the plating current is supplied to the connection pads 10a, which are exposed from the bottom portions of the via holes 36, from the plating power-supply portions 33x via the second wiring patterns 32a and the bumps 11.

Although not explicitly shown in FIG. 2I, a plurality of semiconductor chips 20 are mounted in a plurality of mounting areas to have the similar structure respectively, and respective second wiring patterns 32a in a plurality of mounting areas are connected to the above outer-frame wiring portion 33. In this manner, it is possible to supply simultaneously the plating current to the second wiring patterns 32a formed in a plurality of mounting areas.

In order to expose the plating power-supply portions 33x in the outer-frame wiring portion 33, in the above step of forming the via holes 36 and the step of removing the inorganic insulating film 38 from the bottom portions of the via holes 36, the second interlayer insulating film 34a and the inorganic insulating film 38 on the plating power-supply portions 33x may be etched simultaneously in respective steps.

Then, as shown in FIG. 2H, the resist film 19 serving as an electroplating mask on the inorganic insulating film 38 is patterned. This resist film 19 is patterned in such a way that the plating power-supply portions 33x in the outer-frame wiring portion 33 are exposed and opening portions 19a are formed in predetermined portions containing the via holes 36.

Then, the cathode electrodes 15 are connected to the plating power-supply portions 33x in the outer-frame wiring portion 33 by using the electroplating equipment for the Cu film, and then the plating of the Cu film is started by using the resist film 19 as a mask.

At this time, as described above, since the second wiring patterns 32a as the plating power-supply layer are connected electrically to the connection pads 10a via the bumps 11 of the semiconductor chip 20, the plating current is supplied to the connection pads 10a of the semiconductor chip 20.

Accordingly, the Cu film (conductive film) is formed sequentially toward the upper side from the upper surfaces of the connection pads 10a exposed from the bottom portions of the via holes 36 (bottom up system). That is, after the Cu film (the conductive film) is filled in the via holes 36, the Cu film patterns (conductive film patterns) are formed in the opening portions 19a of the resist film 19. Then, the resist film 19 is removed.

Figure 2J:
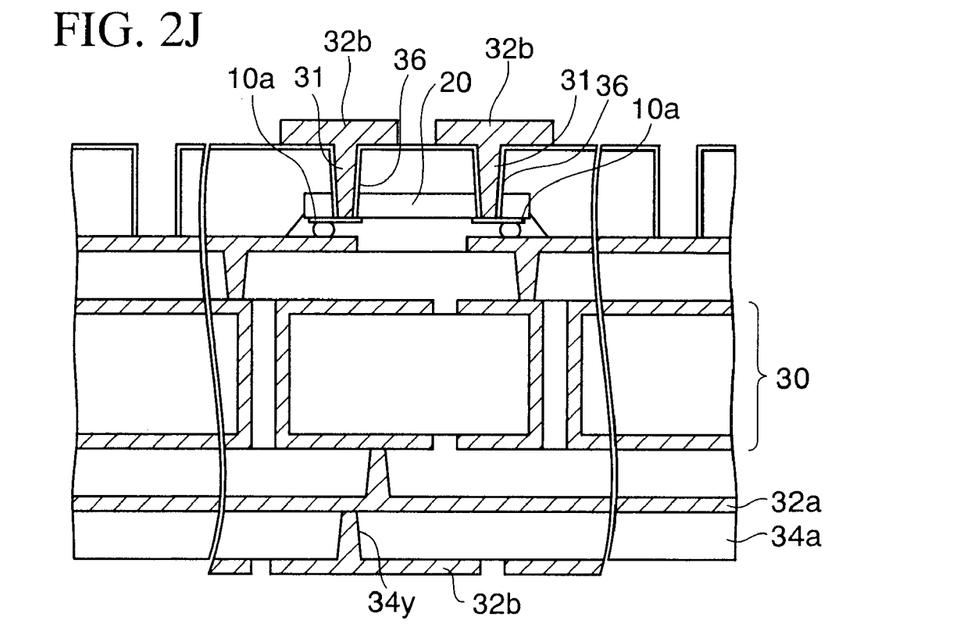

Thus, as shown in FIG. 2J, Cu plugs 31 and the third wiring patterns 32b are formed, and the connection pads 10a of the semiconductor chip 20 and the third wiring patterns 32b are connected electrically mutually via the via holes 36.

In this way, since the Cu film is formed sequentially upward from the bottom portions of the via holes 36 by utilizing the connection pads 10a exposed from the bottom portions of the via holes 36 as the plating power-supply layer, generation of voids in the via holes 36 is prevented and thus the Cu film is filled stably in the via holes 36. Therefore, even if the via holes 36 have a high aspect ratio, e.g., a diameter is about 20 μm or less and a depth is about 40 μm or more, generation of voids is prevented and thus the reliability of the electrical connection between the connection pads 10a and the third wiring patterns 32b can be improved.

In this case, in the step of forming the third wiring patterns 32b, the semi-additive method, or the subtractive method, or the full additive method explained in the step of forming the second wiring patterns 32a may be employed.

Then, the second via holes 34y are formed in the second interlayer insulating film 34a on the surface side of the base substrate 30, on which the semiconductor chip 20 is not mounted. Then, the third wiring patterns 32b each connected to the second wiring pattern 32a via the second via hole 34y are formed.

Figure 2K:
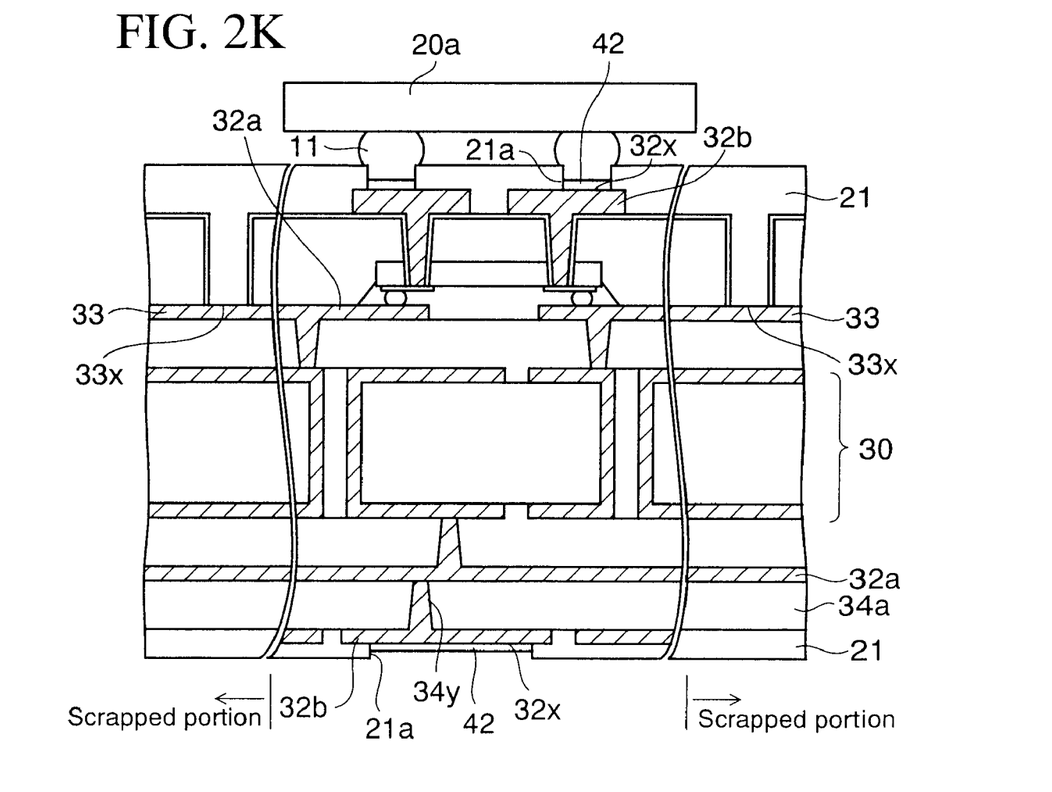

Then, as shown in FIG. 2K, the solder resist film 21 having opening portions 21a at connection portions 32x of the third wiring patterns 32b is formed on both surface sides of the base substrate 30 respectively. Then, the Ni/Au film 42 is formed in the connection portions 32x of the third wiring patterns 32b on both surface sides of the base substrate 30 by the electroless plating using the solder resist film 21 as a mask.

Then, the bumps 11 of the overlying semiconductor chip 20a having the bumps 11 are flip-chip bonded to the Ni/ Au films 42 on the third wiring patterns 32b.

Then, the structural body in FIG. 2K is divided into predetermined areas each of which contains a predetermined number of semiconductor chips 20. At this time, the outer-frame wiring portion 33 connected to the above second wiring patterns 32a is scrapped. In this case, the overlying semiconductor chip 20a may be mounted after the structural body in FIG. 2J on which the solder resist film 21 is formed is divided.

Figure 2L:
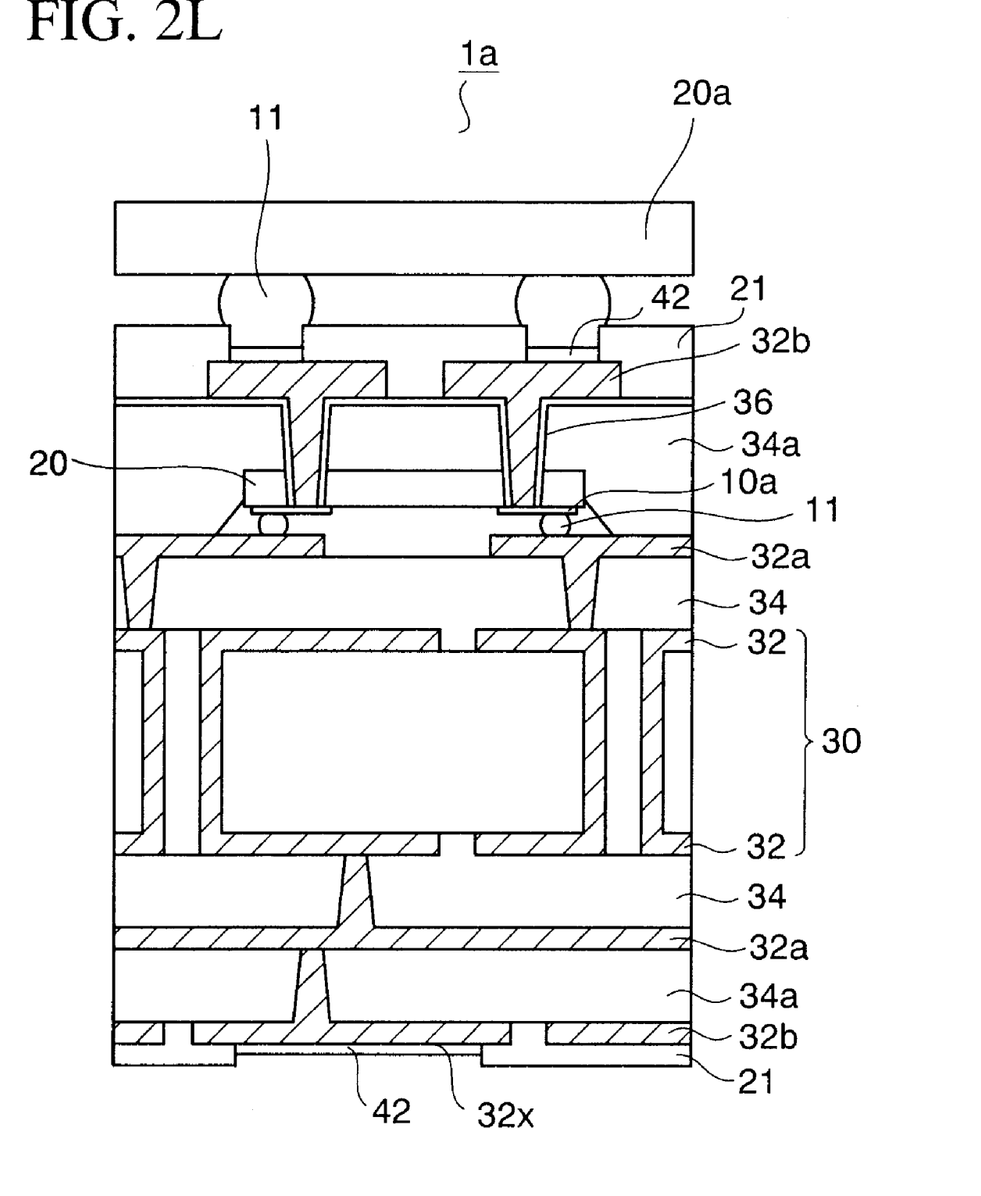

As a result, as shown in FIG. 2L, an electronic parts packaging structure 1a of the second embodiment of the present invention is obtained. In the electronic parts packaging structure 1a of the present embodiment, the structure of LGA (Land Grip Array) type is exemplified. In this case, the solder balls are mounted on the wiring pads on the mounting substrate (mother board), and then the solder balls are connected electrically to the third wiring patterns 32b on the back surface side of the electronic parts packaging structure 1a. Otherwise, inversely the bumps may be mounted on the connection portions 32x of the third wiring patterns 32b of the electronic parts packaging structure 1a.

Figure 3:
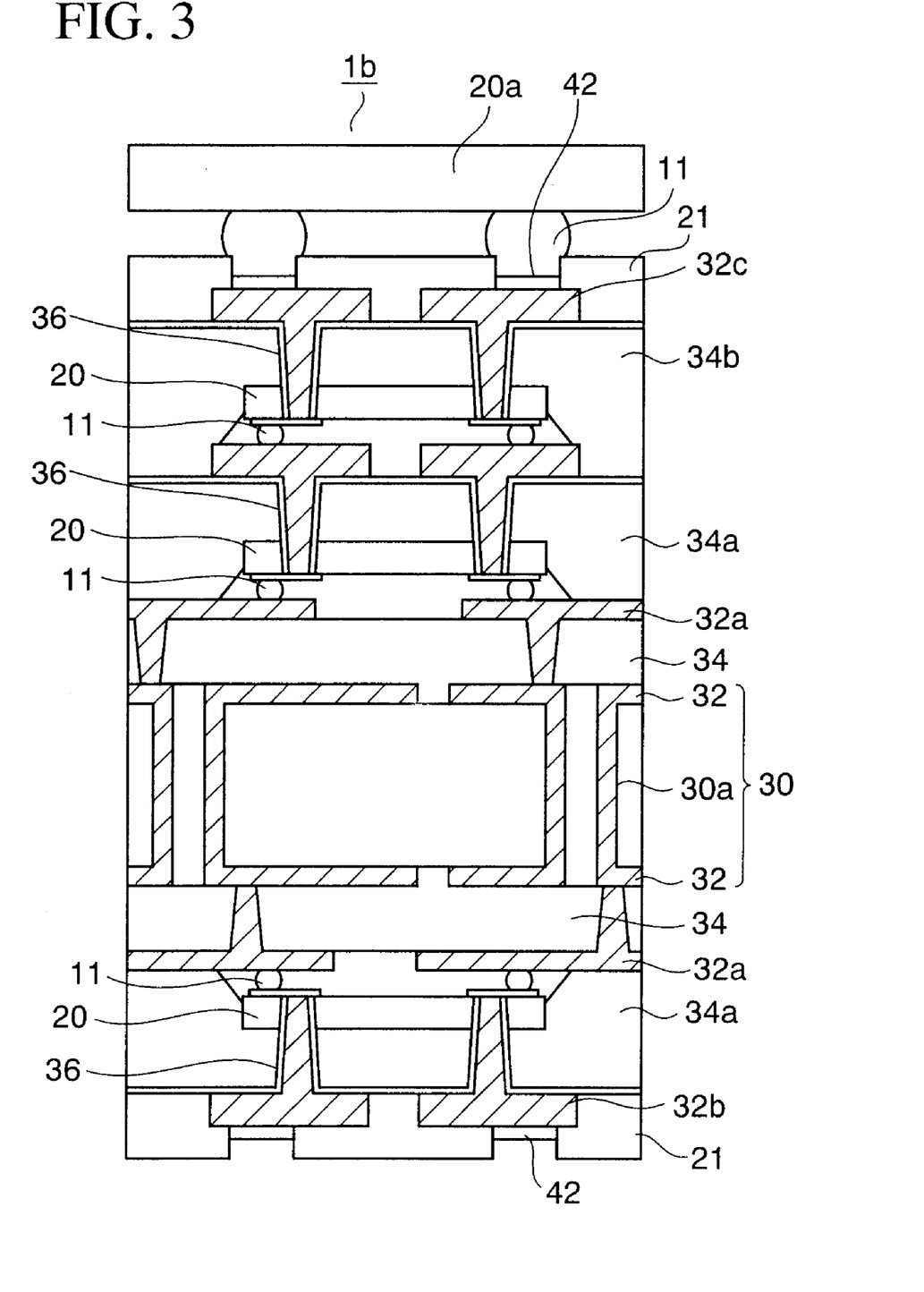
FIG. 3 is a sectional view showing another mode of the electronic parts packaging structure of the second embodiment of the present invention.

Next, another mode of the second embodiment will be exemplified hereunder. FIG. 3 is a sectional view showing another mode of the electronic parts packaging structure of the second embodiment of the present invention. In FIG. 3, the same symbols are affixed to the same elements as those in FIG. 2L, and their explanation will be omitted herein.

In other words, respective steps from the above step of mounting the semiconductor chip 20 in FIG. 2B to the step of forming the third wiring patterns 32b in FIG. 2J may be repeated n times (n is an integer of 1 or more) after the above step in FIG. 2J (after the third wiring patterns 32b are formed). In addition, one semiconductor chip 20 or more may be mounted on the surface side of the base substrate 30 in FIG. 2L, on which the semiconductor chip 20 is not mounted, to have the same structure.

An electronic parts packaging structure 1b as an example of above another mode is shown in FIG. 3. Two semiconductor chips 20 are provided on one surface side of the base substrate 30 in a state that such chips are buried in second, third interlayer insulating films 34a, 34b respectively and their bumps 11 are flip-chip connected to the second, third wiring patterns 32a, 32b respectively. Then, two semiconductor chips 20 are connected mutually via the via holes 36 that are formed in these semiconductor chips and the second, third interlayer insulating films 34a, 34b respectively. Then, the bumps 11 of the overlying semiconductor chip 20a are flip-chip connected to the Ni/ Au films 42 on fourth wiring patterns 32c as the uppermost layer.

Also, the semiconductor chip 20 is mounted on the other surface side of the base substrate 30 in the same structure. Thus, a plurality of semiconductor chips 20 mounted on both surface sides of the base substrate 30 are connected mutually via the via holes 36 and the through holes 30a of the base substrate 30.

In this way, such a mode may be employed that a plurality of semiconductor chips 20 are mounted on both surface sides of the base substrate 30 in a multi-layered fashion while these chips are buried in the interlayer insulating film respectively and also a plurality of semiconductor chips 20 are connected mutually via the via holes 36, etc.

As described above, in the electronic parts packaging structures 1a, 1b of the present embodiment, the interlayer insulating film and the wiring patterns are formed alternatively on both surfaces of the base substrate 30, and the semiconductor chips 20 are flip-chip connected to predetermined wiring patterns in a situation that they are buried in the predetermined insulating film. Then, the via holes 36 each having a depth that reaches the connection pad 10a on the element forming surface side of the semiconductor chip 20 are formed in predetermined portions of the semiconductor chips 20 and the interlayer insulating films that cover the semiconductor chips 20.

Also, the wiring patterns connected to the connection pads 10a of the semiconductor chip 20 via the via holes 36 are formed on the interlayer insulating film that covers the semiconductor chip 20. Since the via holes 36 are formed continuously in the interlayer insulating film and the semiconductor chip 20 by one etching step, their side surfaces are formed as an identical surface that is continued over the depth. In addition, the bumps 11 of the overlying semiconductor chip 20a are connected to the uppermost wiring patters.

Thus, such a mode can be obtained that a plurality of semiconductor chips 20 buried in the interlayer insulating film respectively are connected mutually via the via holes 36, by mounting a plurality of semiconductor chips 20 three-dimensionally in a multi-layered fashion with above method.

The electronic parts packaging structures of the second embodiment can achieve the same advantages as the first embodiment.

Also, in the method of manufacturing the electronic parts packaging structures 1a, 1b of the second embodiment, the via holes 36 are formed by etching continuously the second interlayer insulating film 34a and the semiconductor chip 20 by means of the RIE or the laser. By doing this, the via holes 36 can be formed by the very simple method having the small number of steps. Further, the third wiring patterns 32b connected to the connection pads 10a of the semiconductor chip 20 via the via holes 36 can be formed by one electroplating step so as to stand up above the second interlayer insulating film.

Therefore, the man-hour of the RIE step and the electroplating step employing the expensive manufacturing equipment can be reduced rather than the case where the semiconductor chip 20 is mounted after the through electrodes 16 are formed in the semiconductor chip 20, like the first embodiment. As a result, disadvantages such as an increase in production cost, a delay of the appointed date of delivery, etc. can be overcome.

Also, since the connection pads 10a exposed from the bottom portions of the via holes 36 are utilized as the plating power-supply layer upon forming the third wiring patterns 32b in the via holes 36 by the electroplating, generation of the voids in the via holes 36 is prevented. As a result, since the reliability of the connection between the connection pads 10a of the semiconductor chip 20 and the third wiring patterns 32b can be improved, yield of the production of the electronic parts packaging structure can be improved.

The invention claimed is:

1. A method of manufacturing an electronic parts packaging structure, comprising the steps of:
    flip-chip connecting a connection terminal of an electronic parts having the connection terminal on an element forming surface to a wiring pattern formed on or over a base substrate;
    forming an insulating film in a lower gap of the electronic parts, and on an upper surface and on an entire side surface of the electronic parts and on the base substrate, thereby burying the electronic parts in the insulating film;
    forming a via hole having a depth that reaches the connection terminal by etching a predetermined portion from an upper surface of the insulating film to the element forming surface of the electronic parts; and
    forming an overlying wiring pattern, which is connected to the connection terminal via the via hole, on the insulating film on the upper surface of the electronic parts.

2. A method of manufacturing an electronic parts packaging structure, comprising the steps of:
    flip-chip connecting a connection terminal of an electronic parts, which has the connection terminal on an element forming surface and has a through electrode connected to the connection terminal via a first via hole on a back surface, to a wiring pattern formed on or over a wiring substrate;
    forming an insulating film in a lower gap of the electronic parts, and on an upper surface and on an entire side surface of the electronic parts and on the base substrate, thereby burying the electronic parts in the insulating film;
    forming a second via hole having a depth that reaches the through electrode, by etching a predetermined portion of the insulating film on the through electrode; and
    forming an overlying wiring pattern, which is connected to the through electrode via the second via hole, on the insulating film on the upper surface of the electronic parts.

3. A method of manufacturing an electronic parts packaging structure, according to claim 1, wherein, in the step of forming the via hole, the insulating film and the electronic parts are etched by RIE or a laser.

4. A method of manufacturing an electronic parts packaging structure, according to claim 1, wherein the step of forming the overlying wiring pattern includes the steps of:
    forming a resist film having an opening portion in a predetermined portion containing the via hole on the insulating film;
    forming a conductive film pattern in the via hole and the opening portion of the resist film, by applying a plating upward from the connection terminal exposed from a bottom portion of the via hole by means of electroplating that utilizes the wiring pattern and the connection terminal of the electronic parts connected to the wiring pattern as a plating power-supply layer; and
    removing the resist film to get the overlying wiring pattern.

5. A method of manufacturing an electronic parts packaging structure, according to claim 1, after the step of forming the via hole but before the step of forming the overlying wiring pattern, further comprising the steps of:
    forming an inorganic insulating film on an inner surface of the via hole and on the insulating film; and
    removing the inorganic insulating film from a bottom portion of the via hole to expose the connection terminal on the bottom portion of the via hole.

6. A method of manufacturing an electronic parts packaging structure, according to claim 1, wherein a structure in which a plurality of electronic parts are stacked three-dimensionally in a multi-layered fashion and are connected mutually via the via hole is formed by repeating n times (n is an integer of 1 or more) respective steps from the step of flip-chip connecting the electronic parts to the wiring pattern to the step of forming the overlying wiring pattern.

7. A method of manufacturing an electronic parts packaging structure, according to claim 1, after the step of forming the overlying wiring pattern, further comprising the step of:
    flip-chip connecting a connection terminal of an overlying electronic parts having the connection terminal to the overlying wiring pattern.

8. A method of manufacturing an electronic parts packaging structure, according to claim 1, wherein the electronic parts is a semiconductor chip whose thickness is about 150 µm or less.

* * * * *